US 8,341,564 B1

(12) United States Patent
Fales

(10) Patent No.: US 8,341,564 B1
(45) Date of Patent: Dec. 25, 2012

(54) METHOD AND SYSTEM FOR OPTIMIZING MIGRATED IMPLEMENTATION OF A SYSTEM DESIGN

(75) Inventor: Jonathan R. Fales, South Burlington, VT (US)

(73) Assignee: Cadence Design Systems, Inc., San Jose, CA (US)

( * ) Notice: Subject to any disclaimer, the term of this patent is extended or adjusted under 35 U.S.C. 154(b) by 182 days.

(21) Appl. No.: 12/909,209

(22) Filed: Oct. 21, 2010

(51) Int. Cl.
  *G06F 9/45* (2006.01)
  *G06F 17/50* (2006.01)
(52) U.S. Cl. ........ 716/103; 716/101; 716/104; 716/107; 716/132
(58) Field of Classification Search .................. 716/101, 716/103, 104, 107, 132
See application file for complete search history.

(56) References Cited

U.S. PATENT DOCUMENTS

| | | | | |
|---|---|---|---|---|
| 5,790,416 A * | 8/1998 | Norton et al. | ................. | 716/102 |
| 6,505,327 B2 * | 1/2003 | Lin | ................................ | 716/52 |
| 6,560,766 B2 * | 5/2003 | Pierrat et al. | .................... | 716/53 |
| 6,721,928 B2 * | 4/2004 | Pierrat et al. | .................. | 716/106 |
| 6,996,790 B2 * | 2/2006 | Chang | ............................. | 716/56 |
| 7,269,815 B2 * | 9/2007 | Wein et al. | ..................... | 716/105 |
| 2008/0235055 A1 * | 9/2008 | Mattingly et al. | ................ | 705/3 |

* cited by examiner

*Primary Examiner* — Sun Lin
(74) *Attorney, Agent, or Firm* — Rosenberg, Klein & Lee

(57) ABSTRACT

A method and system are provided for optimizing migrated implementation of a system design. In certain applications, a source hierarchical structure system and a target hierarchical structure system are provided, the hierarchy is abstracted out, intrinsic parameters are encoded and compared between source hierarchical structure and target hierarchical structure to arrive at an optimized change order list for transforming/migrating the source hierarchical structure system to the target hierarchical structure system.

23 Claims, 9 Drawing Sheets

| A | System 1 | A' |
|---|---|---|
| B | Processor | B' |
| C | Memory | C' |
| D | Cache | D' |
| E | Arithmetric Unit | E' |
| F | Transistor 1 | F' |
| G | Transistor 2 | G' |
| H | Volatile Memory | H' |
| I | DRAM | I' |
| J | Transistor 3 | J' |
| K | Transistor 4 | K' |

FIG.7

METHOD AND SYSTEM FOR OPTIMIZING MIGRATED IMPLEMENTATION OF A SYSTEM DESIGN

BACKGROUND OF THE INVENTION

1. Field of the Invention

The present invention is generally directed to a method and system for optimizing migrated implementation of a system design. In certain applications, the present invention is directed to a method and system of reading in a circuit schematic or layout for a first circuit design of a first technology node (e.g. 45 nm), abstracting a hierarchical representation into a tree structure, reading in a target integrated circuit schematic of a circuit of a second technology node (e.g. 32 nm) being related to the source schematic or layout file, abstracting out the hierarchical structure of it, and assessing the most optimized migration steps to transform the source schematic or layout to the target layout.

2. Description of the Related Art

In integrated circuit (IC) design, it is often desirable to reuse existing circuit designs, even when transitioning from one generation or node of technology to another. No tools presently exist to accurately and efficiently migrate or transform a hierarchical structure representation, source layout, or a source schematic of an integrated circuit file from a first technology generation or node (e.g. 45 nm) to a second technology generation or node (e.g. 32 nm) in a sufficiently automated manner.

Layout migration or transformation from one technology node (e.g. 45 nm) to another (e.g. 32 nm) is difficult when the source and target schematic have mismatches in name or structure. Typically, an integrated circuit designer would need to manually intervene on every piece of mismatched data to be migrated and must laboriously create a table of 'from' and 'to' cell names so that the migration tool knows what to do. When there are discrepancies, such as a new cell being added in the design hierarchy, the addition must be done manually. Performing these manual interventions increases the required design time, resources, and costs.

In electronic design automation (EDA), and specifically migration/transformation of schematics/layouts from one technology node to another, such a migration requires extensive manual intervention from skilled design engineers. A common goal is to reuse the already-created source schematic and source layout files, but designers are forced to manually create a cell naming table, manually specifying 'from' and 'to' values, and manually fixing design structure changes, including manual addition of devices, layers of hierarchy, etc.

This approach is not very practical as many errors are often made and migration problems may often arise. Unfortunately, no automated tool is available to effectively aid in this migration process.

The current practice of rendering a source schematic or layout design and a manually created table of 'to' and 'from' values with manual fixing of structural changes is an inefficient, error prone, and labor-intensive manner of performing such a migration or transformation.

Further still, the resulting target layout file will not be in an Layout Versus Schematic (LVS) clean or formally verified, signed off condition and the entire process of verification, layout versus schematic verification, design rule checks (DRC), electrical rule checks (ERC), and the entirety of the formal verification process may well need to be repeated on this new target layout file. This adds substantial delay and cost to such a migration. If problems are found during this formal design verification, the designers will have to go back, modify designs, and iterate through this entire formal verification process over and over again, thereby compounding the inefficiency of the present approach. Consequently, time delays, budget overruns, and inefficiencies are introduced into the overall manufacturing and migration process.

There is therefore a need for a method and system for automatically reconciling hierarchies with automated solution sets and/or optimizing migrated implementation of a system design that does not depend on manual human intervention and to/from table lookup creation with individual element structural changes being fixed.

SUMMARY OF THE INVENTION

An object of the present invention is to provide a system and method for optimizing migrated implementation of a system design.

Another object of the present invention is to provide a system and method for automated hierarchy reconciliation with automated solution sets.

Another object of the present invention is to provide a system and method for automatically migrating a source layout from one technology node (e.g. 45 nm) to another technology node (e.g. 32 nm).

Another object of the present invention is to provide a system and method for comparing hierarchical sets based on inherent or intrinsic parametric values thereto in an automated fashion.

It is yet another object of the present invention to provide a system and method for automatically providing a change list, or solution set to arrive from the source schematic or layout to a target schematic or layout.

These and other objects are attained by a method and system implemented in accordance with the present invention.

The method includes establishing first and second hierarchical representations corresponding to original and migrated implementations of the predetermined system design, each said hierarchical representation defining a plurality of elements respectively populating a plurality of levels, said levels including a root level and a plurality of subordinate levels deriving sequentially therefrom, each subordinate level having at least one element deriving from an element in a preceding level.

The method then includes generating for each level in said first and second hierarchical representations a set of intrinsic parametric values, said set of intrinsic parametric values including at least:
  a first intrinsic parametric value indicative of a type of elements in said level; and
  a second intrinsic parametric value indicative of a type of elements in levels subordinate to said level.

The method then proceeds to compare corresponding intrinsic parametric values of said first and second hierarchical representations; and, generating responsive to the comparison of said intrinsic parametric value a least-cost sequence of changes to transform between said first and second source hierarchical representations.

The system for optimizing migrated implementation of a predetermined system design includes: a storage module, operable to provide and maintain a first and second hierarchical representation corresponding to original and migrated implementations of the predetermined system design, each said hierarchical representation defining a plurality of elements respectively populating a plurality of levels, said levels including a root level and a plurality of subordinate levels deriving sequentially therefrom, each subordinate level having at least one element deriving from an element in a preceding level.

The system further includes a survey module, operable to generate for each level in said first and second hierarchical representations a set of intrinsic parametric values, said intrinsic parametric values including at least:

a first intrinsic parametric value indicative of a type of elements in said level; and a second intrinsic parametric value indicative of a type of elements in levels subordinate to said level.

The system also features a comparator module, operable to compare corresponding intrinsic parametric values of said first and second hierarchical representations; and, a transformation-cost module, operable to generate responsive to the comparison of said intrinsic parametric values a least-cost sequence of changes to transform between said first and second source hierarchical representations.

BRIEF DESCRIPTION OF THE DRAWINGS

FIG. 7 is an exemplary diagram of a lookup table relating de-abstracted hierarchical elements to their respective abstracted source and target hierarchical structural elements;

DETAILED DESCRIPTION OF THE PREFERRED EMBODIMENTS

In the design and implementation of integrated circuits, it is important to maximize reuse of preexisting and formally verified designs. Designers of chips or circuits are sometimes forced to design the chips and circuits from the ground-up. This can be viewed as similar to reinventing the wheel over and over again at each technology node (e.g. 130 nm, 90 nm, 65 nm, 45 nm, 32 nm . . . ). Rather than go through the laborious task of re-creating from the ground-up circuits having the same functionality and essentially the same components every time a new technology node is achieved, it is advantageous to reuse existing previously designed and formally verified integrated circuits. The process of adapting an existing system design in accordance with new technology is generally referred to a 'migration.'

Typically, when designers of circuits that are to be migrated from one technology node to another go about the migration or transformation there will be some changes in the circuit components, devices, or levels of hierarchy. These changes create the most difficulty in analog systems and particularly in the context of the layout migration as opposed to merely schematic migration.

In such a typical migration, engineers are forced to create extensive 'from' and 'to' cell names and tables in order to enable a migration tool successfully migrate one design from one technology to another. In the event that there are discrepancies, such as a new cell being added in the design hierarchy or a new layer of hierarchy introduced, such an addition/modification must be dealt with manually. This is obviously very time-consuming and error prone. The time delays and costs associated with such a procedure are compounded as circuits are revised and iterated through a formal verification process.

In accordance with an embodiment of the present invention, a system and method for hierarchy reconciliation with automated solution sets is provided.

Figure 1:
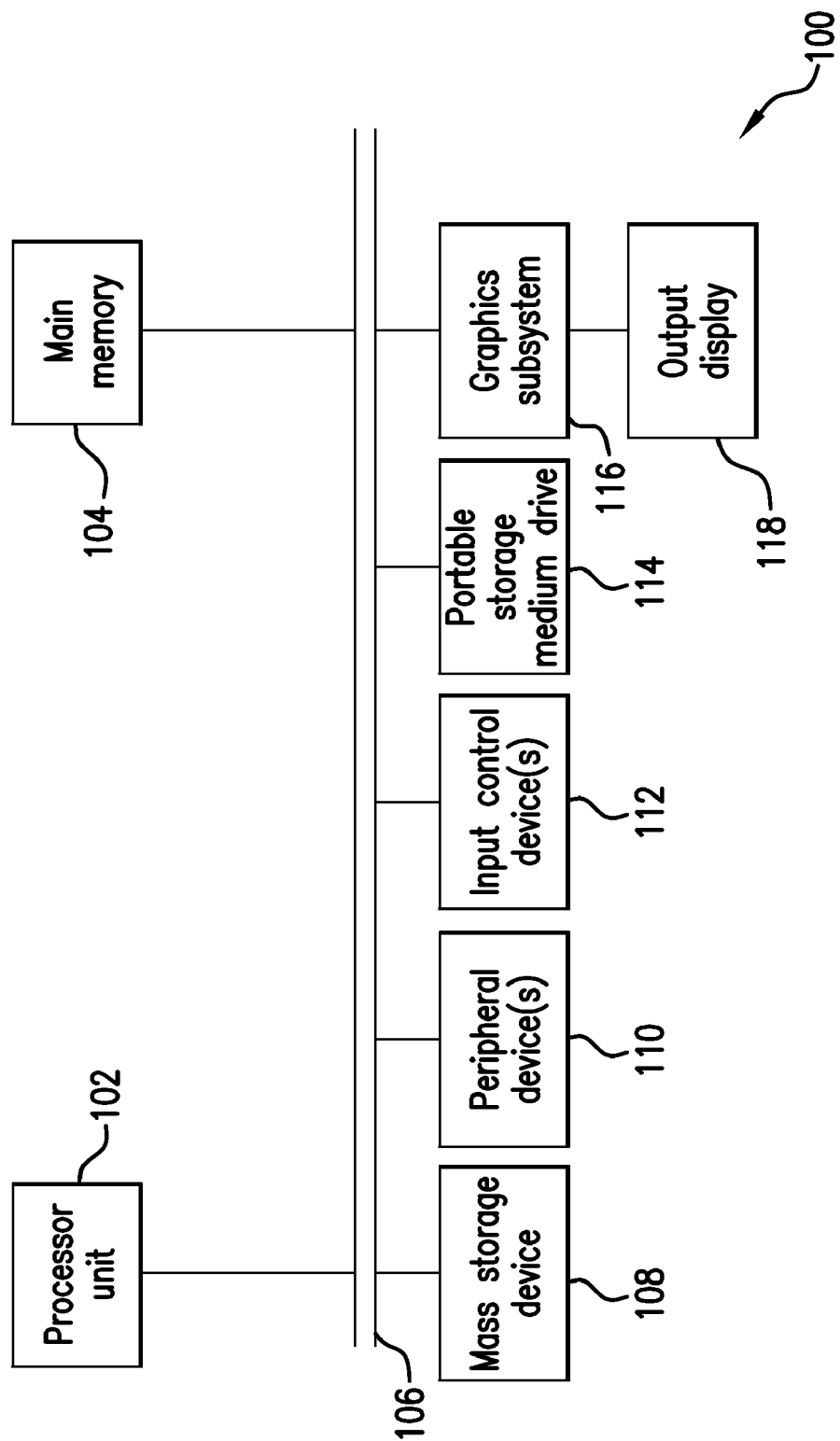
FIG. 1 is a schematic diagram of a system in accordance with one exemplary embodiment of the present invention.

FIG. 1 illustrates a block diagram of a computer system for executing electronic design automation and hierarchy reconciliation with automated solution sets, in accordance with various embodiments of the present invention. A computer system 100 contains a processor unit 102, a main memory 104, an interconnect bus 106, a mass storage device 108, peripheral device(s) 110, input control device(s) 112, portable storage drive(s) 114, a graphics subsystem 116, and an output display 118. Processor unit 102 may include a single microprocessor or a plurality of microprocessors for configuring computer system 100 as a multi-processor system. Main memory 104 stores, in part, instructions and data to be executed by processor 102. Main memory 104 preferably includes banks of dynamic random access memory (DRAM) as well as high-speed cache memory.

For the purpose of simplicity, the components of computer system 100 are connected via interconnect bus 106. However, computer system 100 may be connected through one or more data transport means. For example, processor unit 102 and main memory 104 may be connected via a local microprocessor bus and mass storage device 108, peripheral device(s) 110, portable storage medium drive(s) 114, and graphic subsystem 116 may be connected via one or more input/output (I/O) buses. Mass storage device 108, which may be implemented with a magnetic disk drive, an optical disk drive, a solid state device, or an attachment to network storage, is non-volatile storage device for storing data, databases, and instructions, to be used by processor unit 102. In a software embodiment, mass storage device 108 may store the software to load it into main memory 104. Mass storage device 108 may include any form of non-transitory computer readable media and may include multiple forms of different media.

Portable storage medium drive 114 operates in conjunction with a portable non-volatile storage medium such as a floppy disk, a compact disk read only memory (CD-ROM), a digital versatile disk read only memory (DVD-ROM), or a memory card such as e.g. Secure Digital High Capacity (SDHC), to input and output data and code to and from the computer system 100. In one embodiment, the software is stored on such a portable medium, and is input to computer system 100 via portable storage medium drive 114. Peripheral device(s) 110 may include any type of computer supported device such as an input/output (I/O) interface, to add additional functionality to computer system 100. For example, peripheral device(s) 110 may include a network interface card to interface computer system 100 to a network.

Input control device(s) 112 provide a portion of the user interface for a computer system 100 user. Input control device(s) 112 may include an alphanumeric keypad for inputting alphanumeric and other key information; and a cursor control device such as a mouse, a track pad or stylus; or cursor direction keys.

In order to display textual and graphical information, computer system 100 contains graphic subsystem 114 and output display(s) 118. Output display 118 may include a cathode ray tube (CRT) display, liquid crystal display (LCD), plasma, digital light processing (DLP) or active matrix organic light emitting diode (AMOLED) display. Graphic subsystem 116 receives textual and graphical information and processes the information for output to display 118.

In a software implementation, the EDA software includes a plurality of computer executable instructions, to be implemented on a computer system. Prior to loading in the computer system, the EDA software may reside as encoded information on a computer-readable tangible or non-transitory medium such as a magnetic floppy disk, a magnetic tape, CD-ROM, DVD-ROM, flash memory, or any other suitable computer readable medium.

In a hardware implementation, such a system may be implemented in any suitable computer based platform known in the art. For example, the system may comprise suitable storage media and one or more dedicated processors or share one or more processors executing/controlling other functions, wherein the employed processor(s) is programmably configured with processor instructions for performing the functions described herein. Suitable circuits may also be developed to execute certain aspects of these functions.

Figure 2:
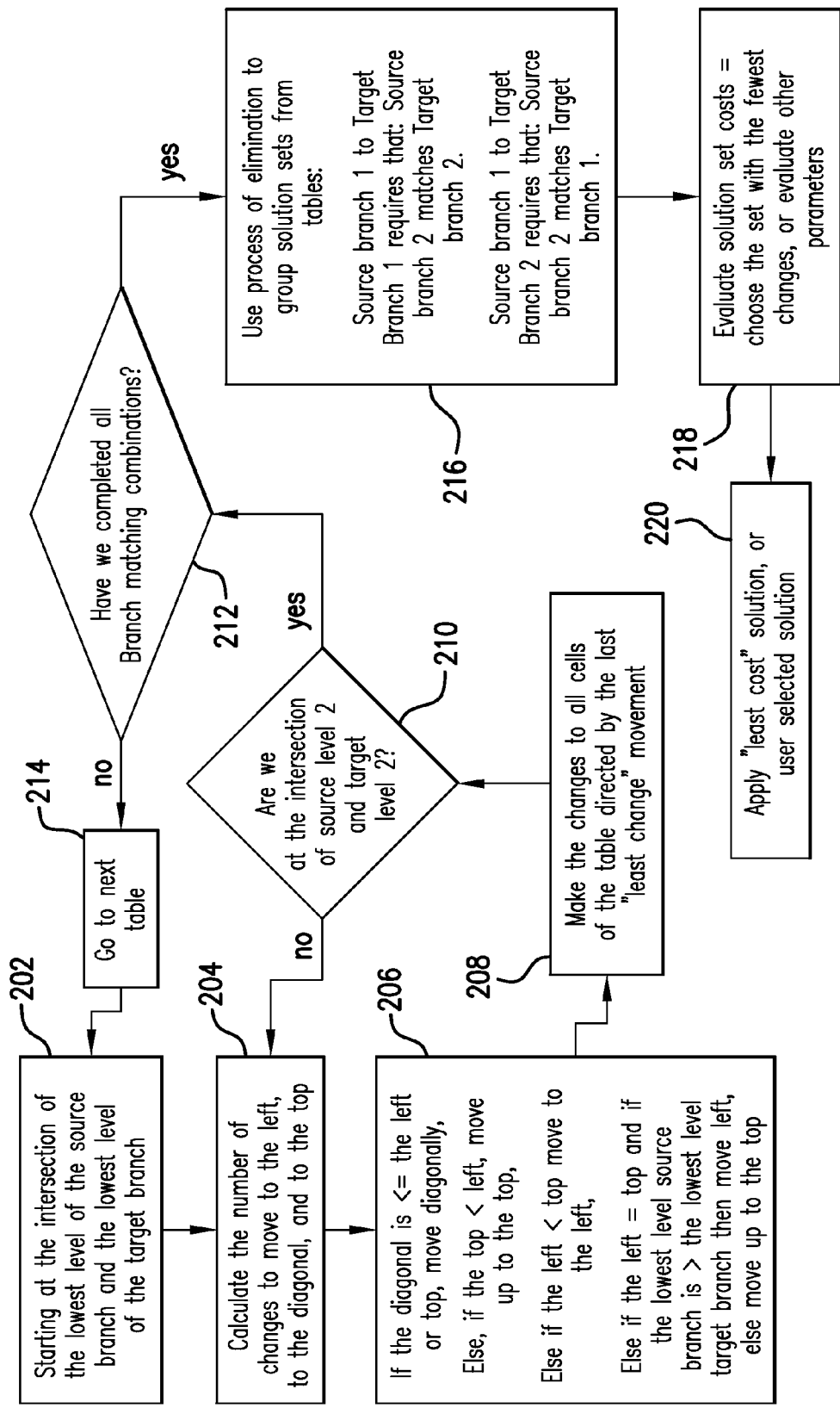
FIG. 2 is a flow diagram of a method for a hierarchy reconciliation with automated solution sets in accordance with one exemplary embodiment of the present invention.

FIG. 2 is a simplified flow diagram and the method for hierarchy reconciliation with automated solution sets in accordance with an embodiment of the invention of the subject Patent Application. A hierarchy structure is a structure that has a root node and at least one subordinate level of terminal-nodes depending from the root node. Such a hierarchy may have many nodes, branches, and levels.

Initially, two files having a hierarchical structure are provided. These two structures or files may be a source integrated circuit schematic and a target integrated circuit schematic. Alternatively, a source integrated circuit layout/schematic may be provided, minor changes may be introduced by a designer to the source integrated circuit design to create a transformed target integrated circuit schematic.

At this stage each of the elements, leaves, end-nodes, terminals, terminal-nodes (used interchangeably throughout—with the exception of technology nodes e.g. 45 nm) or branches, sub-branches, branch-nodes, vertices (used interchangeably herein) may have values such as a name or data; or a tag like a metadata/descriptor or other parameters or properties associated therewith. In a first abstraction step all of this information is stripped off and saved into a lookup table for later de-abstraction or lookup. The result is that these two hierarchical circuit structures are abstracted to focus merely on the hierarchical structure present therein—for the moment ignoring tags and values of elements.

Such abstracted or summarized data representing the hierarchical structure of the originally provided files may be saved in any format known to one of skill in the art including a tree structure, lists, flat-files, linked lists, heaps, databases or any other suitable data structure to efficiently represent a hierarchical structure. An exemplary hierarchical structure can be seen at FIG. 4 where a first level, parent, seed, root-element, root-node, or root-level (used interchangeably herein) is denoted as 401. Branch I 402 (headed by element B) is shown on the left hand side while Branch II 403 (headed by element C) is shown on the right hand side. The root-node A 401 is shown at a first level L1 while branch I and branch II are shown as starting at a second level L2. Elements D, E, and H are shown at L3; elements F, G, I at L4, and J, K at L5. Element B 404 is a branch-node because it branches to subordinate terminal-node D and branch-node E. J 407 is a terminal-node because it is seen to terminate a branch.

Figure 6:
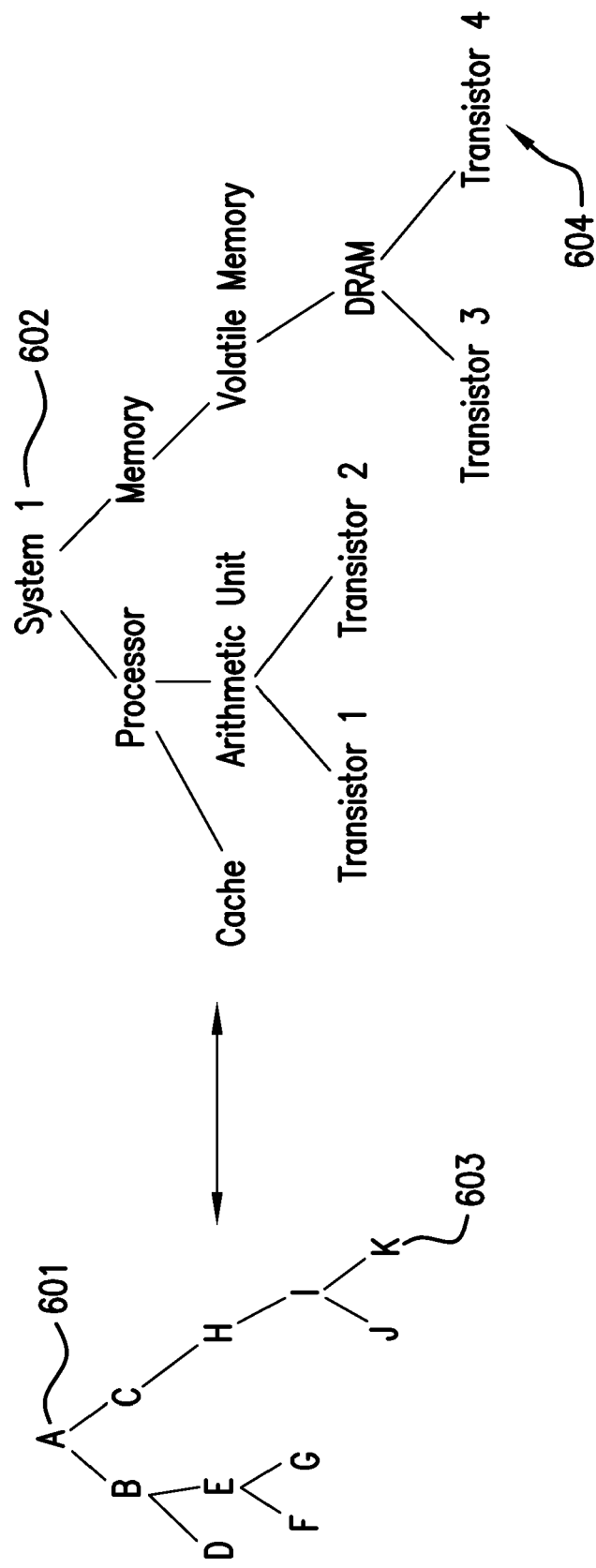
FIG. 6 is another exemplary chart showing an abstracted hierarchical relationship with relation to its de-abstracted hierarchical structural relationship.

FIG. 6 shows an abstraction step of taking a fully laid out hierarchy such as a source integrated circuit schematic file representing a simplified system 1 having a processor and memory, cache or arithmetic unit and concluding at the lowest or furthest level from the root having nodes such as transistor 1, transistor 2, transistor 4, shown as 604. In a real world application, system 1 may represent a microprocessor, a network, an integrated circuit, or any item having a hierarchical structure, and may even be composed of potentially millions of elements.

In such an abstraction step the values and tags or other properties associated with each individual node or branch are stripped out and saved into a lookup file such that for example transistor 4 value shown at 604 would then be represented by merely a symbolic reference such as K on the left hand side of the FIG. denoted as 603. Alternatively, to reduce computational costs, a new empty hierarchy may be created to mirror the hierarchical structure represented in the full system.

Once the tree or hierarchical structure of both the source and target systems are abstracted into a tree or other suitable data structure and their corresponding values, tags, or other associated properties are separately stored into a lookup table, a next step of encoding of intrinsic tree properties may begin. Alternatively, such an encoding step may be performed on the hierarchy in situ, or in an original file representing the whole system.

In each hierarchical or tree structure, each individual node or sub-branch has several intrinsic properties. In a preferred embodiment, the intrinsic parameters of interest may include:
(1) a value indicative of a type of elements in the current level; and
(2) a value indicative of a type of elements in subordinate levels.

In another embodiment, the intrinsic parameters of interest may include:
(1) a number of nodes at the current level,
(2) a number of sub-branches at the current source level, and
(3) a cumulative number of nodes in the subordinate source levels.

In various other embodiments, different intrinsic parameters or intrinsic parametric values may be used. Additional parameters may be used to better automate the process. Some tradeoff between level of automation, algorithmic simplicity, and the number of parameters necessary should be considered. For example, if a naming convention for circuits in a source hierarchy was known in advance, and some additional branch correlation information could be derived therefrom, such a parameter may be included in consideration to further aide the convergence of least cost solutions.

In an encoding step (as discussed above) these intrinsic tree properties are encoded for each level of each hierarchy/tree (used interchangeably herein) of both the source and target hierarchies.

Figure 4:
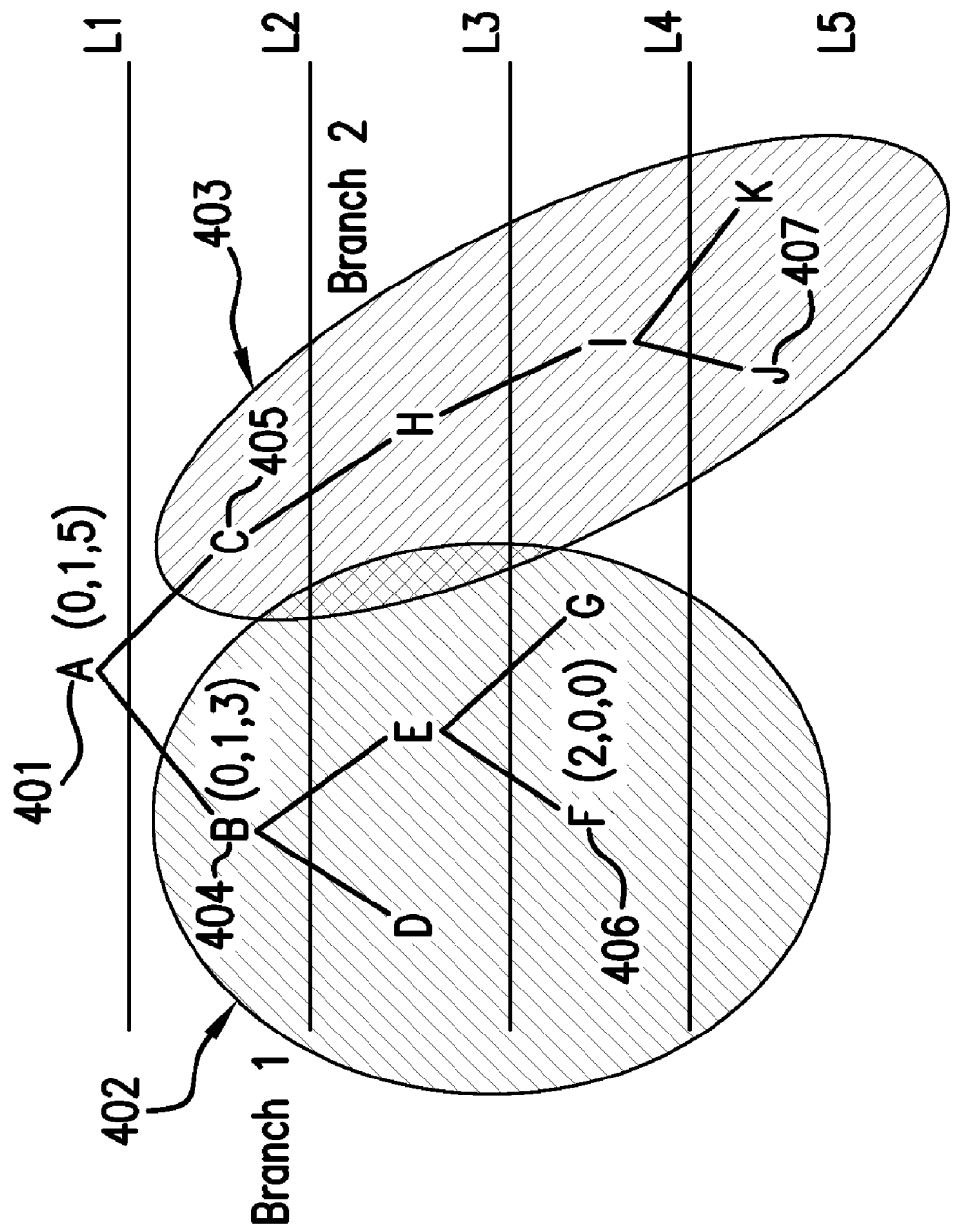
FIG. 4 is an exemplary chart showing an illustrative hierarchical structure.

For example, in FIG. 4, L1 is encoded as the triplet value (0,1,5) signifying that there are 0 nodes in L1, 1 sub-branch, and 5 cumulative nodes in subordinate source levels (D, F, G, J, and K). Further, L2 may be encoded as (0,2,5). In a preferred embodiment, the level L2 will be broken up into branches—as many branches are there are in that level in that hierarchy. In FIG. 4 there are two branches B, and C, so two branches are considered separately 402 and 403. In another hierarchy there may be very many branches. L2 branch 1

(402) may then be encoded as (0,1,3) and L2 branch 2 may then be encoded as (0,1,2). Such encoding should traverse each level until the final level L5 has been encoded.

In a preferred embodiment, a subtraction operation is then performed on the two hierarchy's encoded intrinsic tree properties subtracting each individual corresponding intrinsic tree property for each node or sub-branch at each level to progress through each encoded intrinsic tree properties. In a preferred embodiment the encoded intrinsic tree properties are stored in a matrix, however, as should be apparent to one of ordinary skill in the art, any suitable data structure may be used, such as a flat file, list, table, or database.

Once the subtraction operation of the corresponding intrinsic tree properties has been completed, the results show a delta or difference between corresponding tree elements. These delta values are placed into a corresponding delta matrix where the delta values are the difference between each of corresponding intrinsic tree properties of the source and target hierarchies. Such a delta matrix is, in a preferred embodiment, represented by a matrix structure, however, any data structure capable of maintaining the relationship between intrinsic tree properties and their locations corresponding to the source and target hierarchy abstracted tree and encoded intrinsic tree properties may be used.

FIG. 2 starts at step 202, starting at the intersection of the lowest level of the source branch and the lowest level of the target branch (lowest level being furthest from the root or head of the hierarchical tree structure). At step 204 a calculation is made as to the number of changes in nodes or branches (a cost, delta, or difference, used interchangeably herein) to move from the starting intersection to a left cell, to a diagonal cell, or to a top cell.

Step 204 may preferably be performed using a summation of absolute values of the independent intrinsic tree properties of each cell. For example, a left cell may have, in a preferred embodiment, a triplet of the intrinsic tree properties discussed supra, and including a number of nodes at the current source level, a number of sub-branches at the current source level, and a cumulative number of nodes in a subordinate source levels.

In an optional embodiment, the weight of the different intrinsic tree properties may be considered differently. For example, adding an extra layer of hierarchy may be accorded a greater weight, and may be multiplied against a factor number or coefficient to increase its cost relative to merely adding an additional node, leaf, or device (used interchangeably herein).

Once the calculation of adjacent cell costs or values is completed at step 204, the flow chart of FIG. 2 progresses to step 206 where a comparison is made. The total costs of the adjacent cells may be compared in any manner known to one of skill in the art.

In a preferred embodiment, a comparison at step 206 would proceed as follows: if the diagonal cell from the current cell is $\leq$ to the left cell or top cell, move diagonally. Else, if the top cell is less in cost than the cost of the left cell, move to the top cell. Else, if the left cell value is less than the top cell value move to the left cell. Lastly, else, if none of the previous conditions have been satisfied, and the left equals the top cell and if the lowest level source branch is greater than the lowest level target branch, then move left, else move up to the top.

At step 208 the move at step 206 is considered, the delta matrix or results matrix (as illustratively seen in FIG. 3 having target data on the y axis and source data on the x axis) is updated in such a manner as to reflect the most recent movement or changes to the hierarchical structures. A diagonal movement herein indicates a one-to-one hierarchical level match, and a vertical movement indicates an addition of a level of hierarchy is needed in the source to match the target, and a horizontal movement indicates a removal of a level of hierarchy is needed in the source to match the target.

At step 210, a decision block is encountered and it is evaluated whether the traversal through the delta matrix has been completed. Such a completion of the traversal of the delta matrix can be signified by either ending at the root cell itself (the intersection of the root of both the source and target hierarchies) or, in a preferred embodiment, reaching the intersection of a source level 2 (a first subordinate level to the root level) and a target level 2. If we have not reached the end of the delta matrix, we repeat back to step 204 where a calculation and movement traversal through the delta matrix is continued. If, however, the delta matrix has indeed been traversed the flow chart moves to step 212.

At step 212 a second evaluated is performed. Step 212 evaluates whether all branch matching combinations have been completed. In some instances where a relatively simple hierarchical structure is provided, the entirety of the hierarchical structure may be compared between source and target; however, in some situations with more heavily populated hierarchies, breaking each hierarchical structure into a plurality of branches at the first level subordinate to the root level (L2) may aid by partitioning computation or simplifying branch comparisons.

Step 212 may be used in such a situation where a plurality of branches of each hierarchical structure had been broken off and considered separately. In such a situation at step 212 if all branch matching combinations have not been made, a movement back to step 214 which reiterates through a next table with the corresponding branch is then processed through the normal path of step 202, 204, 206, and 208. Thereby, branches of hierarchical tree structures may all be compared to provide a plurality of different solutions to the migration from a source hierarchy to the target hierarchy.

Once the evaluation at step 212 is affirmative, the flow chart progresses to step 216. At step 216 a process of elimination may be initiated to group solution sets from tables. Each table herein may represent a matrix of a comparison along a horizontal axis of a source hierarchy branch and along a vertical axis of a target hierarchical branch. The horizontal/vertical may be switched from source to target or target to source. Thereby, each table may represent a comparison between, for example: branch 1 of source hierarchy and branch 1 of a target hierarchy. Conversely, a branch 1 of a target hierarchy may be compared against a branch 2 of a source hierarchy. In some instances such a comparison of branch 1 to a branch 2 may not be sensible and may be eliminated through heuristics or manual user intervention, or a process of elimination.

Such a process of elimination may reduce computation time and potentially nonsensical solution sets. For example, if source branch 1 is to be compared to target branch 1, this may require that source branch 2 matches target branch 2. Conversely, should source branch 1 be compared to target branch 2, this would then require that source branch 2 match target branch 1.

The flow chart of FIG. 2 then proceeds to step 218 where an evaluation of solution set costs is performed. Such an evaluation in a preferred embodiment would choose the solution set with the fewest cumulative or total changes. Alternatively, the solution set cost can be evaluated with other parameters, or by multiplication of coefficients against certain changes. As discussed supra, certain modifications may be more expensive to perform than others. For example, adding a layer of hierarchy may be considered more expensive or costly than adding an additional device or node to the source hierarchy.

Flow continues to step 220 wherein a user may manually intervene and choose a preferred solution set, or such a least-cost solution as calculated at step 218 may be used automatically.

Figure 3:
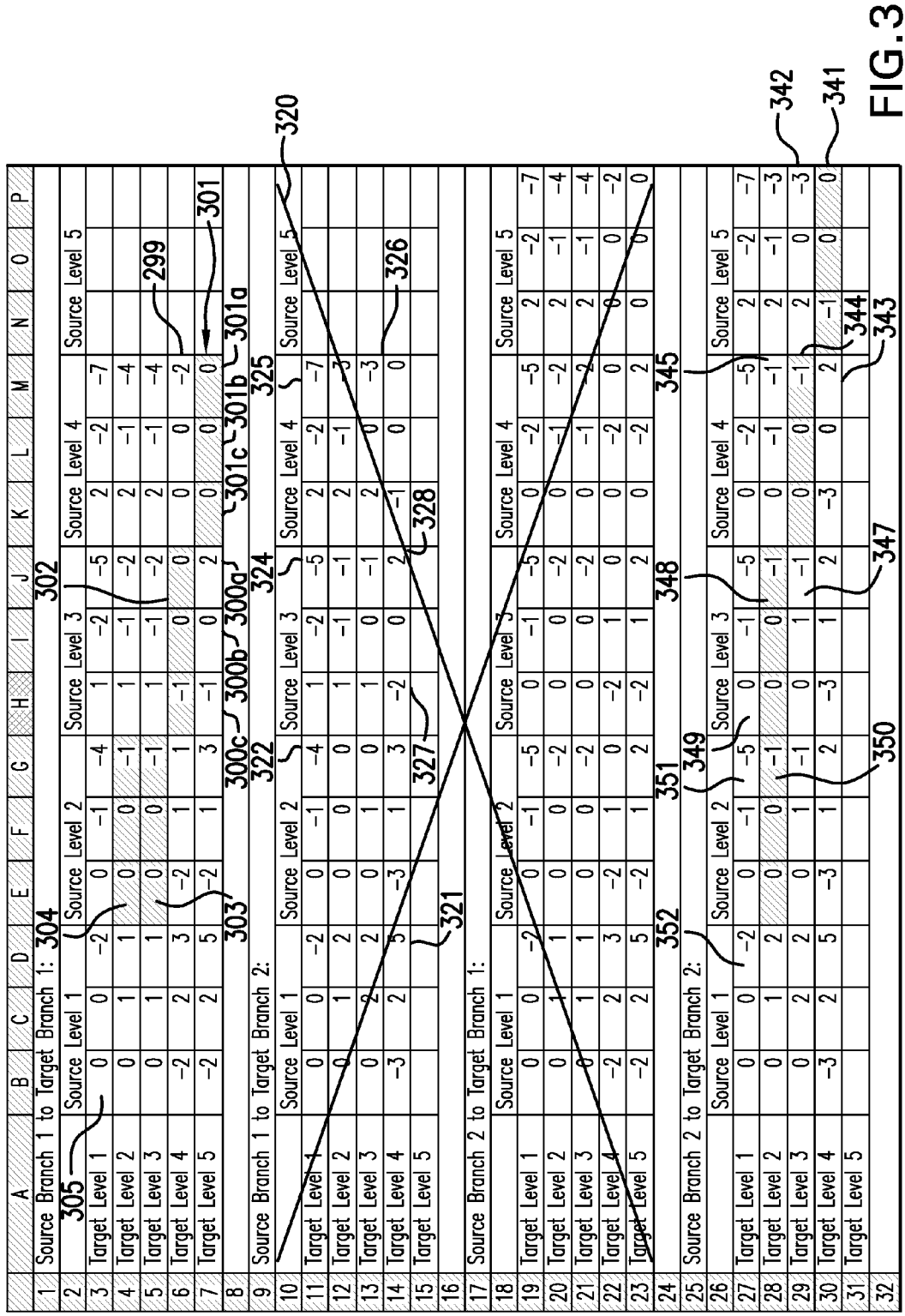
FIG. 3 shows an exemplary arrangement of several delta matrices in accordance with another embodiment of the present invention.

FIG. 3 is an exemplary group of tables or matrices, or delta matrices of differences between encoded intrinsic parameters of corresponding hierarchical structures. It is seen at element 320 that two tables (source branch 1 to target branch 2 and source branch 2 to target branch 1) have been eliminated through the use of an X. This is merely exemplary or illustrative, and any means known to one of ordinary skill in the art may be used to discount certain tables in favor of other more preferable tables. The decision to remove these two tables from consideration may be arrived at through step 216 where a process of elimination or a forward looking predictive heuristic considering rough approximations of total cost may be used. In a cursory or preliminary scan of the delta values, 321, 322, 324, 325, 326, 327, 328 may be viewed as excessively costly and used in arriving at a preliminary conclusion that such a table is not beneficial or desirous.

Starting with a non-eliminated table such as source branch 1 to target branch 1, traversal of this matrix preferably starts at an intersection of the lowest source level and the lowest target level (lowest level refers to furthest from the root level). Cell 301 (highlighted) may preferably be such a starting point. Cell 301 represents a triplet of inherent or intrinsic tree parameters including 301A (difference between cumulative number of nodes in subordinate source levels between source and target), 301B (difference of sub-branches at the current source level between the source level and target level), and 301C (difference between the number of nodes at the current source level versus the target level). Starting at such a point 301 corresponds with FIG. 2 step 202 of starting at the intersection of the lowest level of the source branch and the lowest level of the target branch.

Returning to FIG. 2, it is seen that at step 204 a calculation is made, preferably, by summing the absolute value of the triplet values of adjacent cells, such as the triplet values 301A and 301B of cell 300. Illustratively, the absolute value of 2 (300A plus the absolute value of −1 (300B)) are summed together for a total of 3.

In optional embodiments, the individual triplet values may be multiplied by some factor or coefficient agent to give relative weight and cost to different changes. Such a summing or computation of other adjacent cells proceeds to cell 302 where the absolute value of the summation would merely be 1. Lastly, the summation of adjacent cell 299 would also be computed to equal 2. Therefore, it can be seen that cell 299 at a value of 2 and cell 300 at a value of 3 are both greater than adjacent cell 302's value of 1. Thus, as seen in step 206 of FIG. 2, a move would be made to highlight cell 302. Such a move may preferably be recorded in an established changed or change order list file. Such a change order list may indeed be represented as a list, a table, or any other data structure capable of storing several movements. In some embodiments, a cursor or placeholder may be used to mark the current location of the delta matrix structure.

In a preferred embodiment following the move to cell 302, the cells, or at least the adjacent cells to the left, diagonal, and upwards should have values updated due to the changes in structure necessitated by the move to cell 302. At cell 302 a computation of relative cost or weight is repeated again on its adjacent cells. Such an evaluation results in a least cost move to cell 303. Again, the table is updated, the comparison to adjacent cells is made, and a move to cell 304 is made.

As is seen at step 210 in FIG. 2 we have indeed reached an intersection of source level 2 and target level 2. In such an embodiment where hierarchy is broken up into a plurality of branches, the source level 2 and target level 2 thereby represent the subroot or root of each individual broken branch. In an alternate embodiment, where branches or sub-branches are not broken off but each hierarchical structure is considered in whole, the ending cell may indeed be the intersection of source level 1 with target level 1 or the root of the entirety of the tree or hierarchical structure.

As the comparison between source branch 1 and target branch 1 has been elected, a process of elimination, as seen in FIG. 2, step 216 may be made, and the assumption that if source branch 1 is compared to target branch 1, then other comparisons of source branch 1 or target branch 1 may be eliminated, in this case resulting in the elimination shown through the graphical illustration of an X 320. After the process of elimination at 216 has been completed, a comparison between source branch 2, and target branch 2, for example, may next be computed.

In the same manner that the source branch 1 to target branch 1 comparison matrix or delta matrix was traversed, the source branch 2 to target branch 2 delta matrix may be traversed as well. Such a traversal may start at the intersection of source level 5 and target level 4 (lowest levels of each source and target hierarchies present). Such comparison begins at cell 341 (highlighted). A summation, computation, or comparison is performed on adjacent cells 342, 343, and 344 to determine a least-cost next move.

It is seen that the preferred manner of summing an absolute value of individual triplet cells of cell 342 would result in an absolute value of 5, the summation of absolute values of cell 343 would also result in a value or cost of 5, and the summation of the triplet values of cell 344 would merely result in an absolute value or cost of 1. Therefore, a move to the cell 344 would then progress. The table values are then preferably updated. In a preferred embodiment, merely the cells appearing left and/or above the current cell (344) (levels closer to root) are recalculated. Alternatively, merely the cells adjacent, left, diagonal, and above current cell are updated to reflect the move from cell 341 to cell 344.

At cell 344 another computation is made comparing the absolute values of cells 345, 347, and 348. It is seen that through such a summation of absolute values, cell 348 holds the least cost or least value. Therefore, the current position, optionally denoted by a cursor, is moved to represent the current move to cell 348.

At cell 348, the computation is repeated comparing cells 349, 350, and 351. Such a computation would yield the lowest cost move to be a movement from cell 347 to cell 350 (highlighted). As such a move places the cursor or current location at the intersection of source level 2 and target level 2 the computations are complete and the source branch 2 has been reconciled to target branch 2.

FIG. 4 shows an exemplary hierarchical structure abstracted to remove tags, values, and other parameters that may be present in such a hierarchy as the source schematic file or source layout file. Herein, it is seen that the root value 401 is denoted by an A, a first branch 402 headed by sub-branch 404 (B), and a second branch 403 headed by a second branch C 405. It is seen that branch 1 level 2 has intrinsic parameters which may be represented in a preferred embodiment by a triplet of values. These intrinsic parameters in a preferred embodiment represent: a number of nodes at the current level, a number of sub-branches at the current level, and a cumulative number of nodes in the subordinate levels.

Here it is seen that branch 1 level 2 would have an intrinsic parameter triplet value of 0 1 3, representing the three intrinsic parameters. This is seen because branch 1 level 2 has 0 leafs or nodes or devices, but yet has one sub-branch B 404 resulting in a fork terminating in D on one side and F and G on a second side. Lastly, the third triplet value 3 is due to the fact that the cumulative number of nodes in the subordinate levels equals 3. This can be seen as D, F, and G. Such an encoded triplet value of intrinsic tree parameters for branch 1 level 2 B 404 may be compared with the encoded triplet of intrinsic tree parameters of the root (A 401). Level 1 may be shown to have an encoded triplet value of 0 1 5 wherein there are 0 nodes, leaves or devices at level 1, however, level 1 does have a branch or sub-branch, and the cumulative number of nodes in the subordinate levels is equal to 5 considering D, F, G, J, and K.

Such an encoded triplet value of intrinsic tree parameters may be compared, for illustration purposes, with an encoded triplet value of branch 1 level 4 shown on FIG. 4 as F and G. Such an encoded triplet value may yield 2 0 0. Such an encoding is due to the fact that there are two leaf, or node cells (F and G) at the current branch 1 level 4, yet there are 0 sub-branches, and 0 nodes or leaves in level subordinate (within this branch to level 4).

Figure 5:
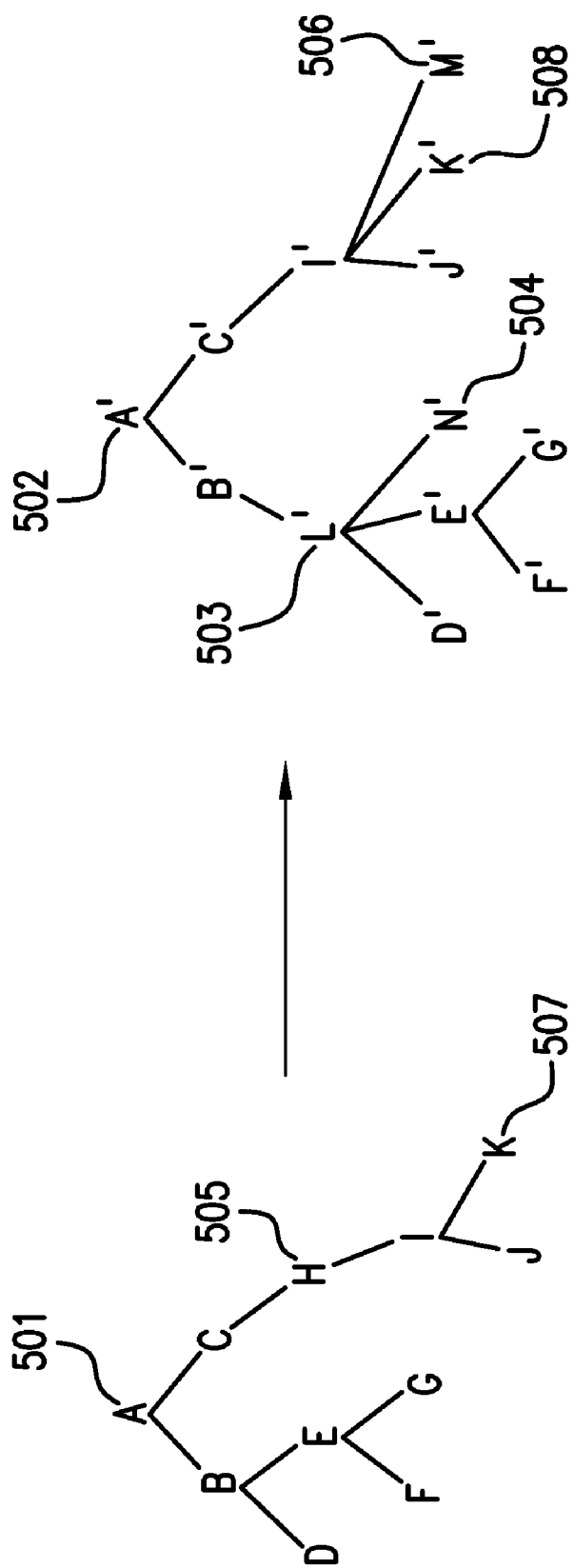
FIG. 5 is an exemplary chart showing an illustrative source hierarchical structure transformed to a target hierarchical structure.

FIG. 5 takes a step back, or views the bigger picture of the comparison between a first hierarchical structure 501 with a second hierarchical structure 502. It may be assumed, in a preferred embodiment that there is some relationship between the hierarchical structure 501 and the hierarchical structure 502. In an electronic design automation or integrated circuit migration/transformation, it may be assumed that a tree representing the hierarchical structure 501 may indeed represent a schematic design for a source integrated circuit at a first technology node (e.g. 45 nm). Similarly, the tree representing the hierarchical structure 502 may indeed be representing the same or similar integrated circuit slightly modified for a different technology node (e.g. 32 nm). In such a migration or transformation from the source integrated circuit schematic of the first technology node to a target schematic or layout of a second technology node (e.g. 32 nm), it can be seen that there is some knowledge regarding the relationship of hierarchical structure 501 with hierarchical structure 502.

In the broader context, we are comparing the tree 501 with tree 502 (tree, and hierarchical structure, used interchangeably herein). During such a comparison it can be seen that element H 505 in tree 501 has been removed through the migration such that tree 502 lacks one layer of hierarchy represented by H. It is now seen that I' which relates in some way to element 1 and 501 has been moved up a layer of hierarchy and now depends immediately from C' (which itself there is some relation to element C in tree 501). Conversely, it can be seen that element L' 503 in tree 502 has been added between element B and D and E. Such change results in an added layer of hierarchy represented by L' 503. Again, it may be assumed, in a preferred embodiment that there is some relation between B and B'; D and D'; and E and E'.

Further, it is seen that element N' 504 has been added to tree 502. Lastly, it may be seen that while tree 501's node K 507 has remained as K' 508 in tree 502, it is seen that element M' 506 has been added to tree 502. An embodiment of the present invention computationally analyzes such a difference between a tree 502 and a tree 501, iteratively analyzing the changes therebetween and proposing an optimized migration/transformation or change order list to propose individual additions of nodes or layers of hierarchy to arrive at the target tree 502 from the source tree 501 in the most optimized manner.

FIG. 6 shows a bidirectional abstraction or de-abstraction step whereby a tree such as 501 in FIG. 5, shown herein as tree 601 here in FIG. 6 is merely an abstracted representation of the hierarchical structure of potentially an entire system shown as tree 602. Each individual hierarchical tree structure, such as 602 may indeed represent the entirety of an integrated circuit schematic having potentially thousands of different nodes, branches and sub-branches. It is shown in tree 602 that such a hierarchical structure may originate with a root represented herein by system 1 and progressed down to constituent elements as the hierarchical layers are traversed. For example, system 1 may be composed of a processor and a memory and in turn the processor is composed of a cache and an arithmetic unit and in turn the arithmetic unit is composed of a transistor 1 node and a transistor 2 node.

The memory may be composed of volatile memory which itself may be composed of a DRAM or (dynamic random access memory) which itself may be composed of a transistor 3 and a transistor 4 (604). These individual values such as "system 1", "processor", "memory", or "arithmetic unit" may be abstracted out as they are not used until a final stage of a preferred embodiment. Rather, these values of each hierarchical element are abstracted out and merely the hierarchical structure is abstracted into a tree 601 where the inherent or intrinsic properties of each level are used for computations in a preferred embodiment herein.

FIG. 7 shows an exemplary lookup table preferably used during the abstraction and de-abstraction phases where a value such as "system 1" may merely be represented by a letter A, or A'. Once a lookup table has been constructed, the tree structure, for example, tree 601 may be created without regard for its individual values, tags, or metadata, and may be processed in a preferred embodiment level-by-level considering merely intrinsic parameters or properties of each level.

Figure 8:
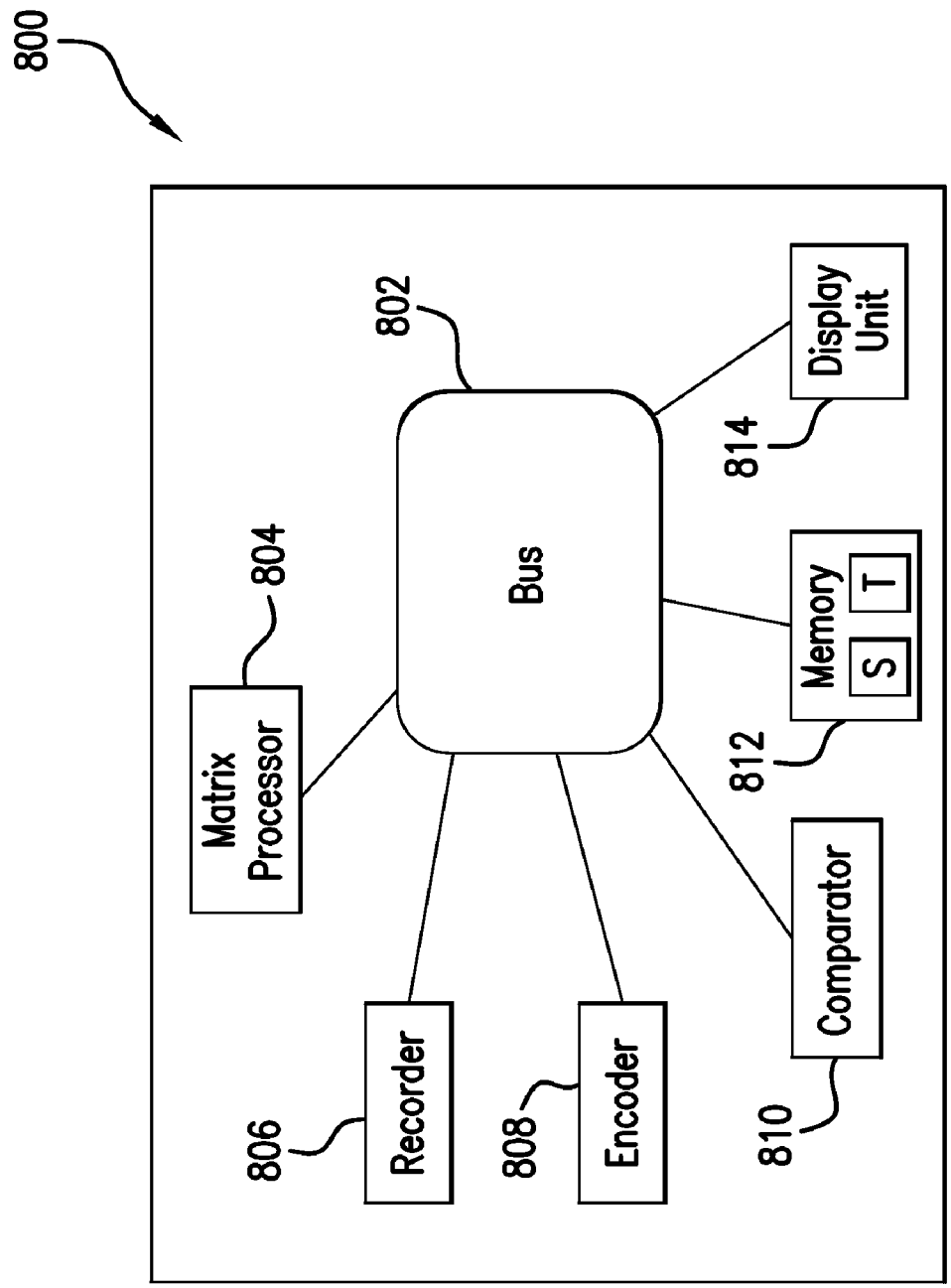
FIG. 8 is a schematic diagram of a system in accordance with another exemplary embodiment of the present invention.

FIG. 8 shows an exemplary schematic of a system in accord with one aspect of an embodiment herein. It is seen that such a system 800 may include a display unit 814 for displaying results or user interface. A memory element 812 may contain a source schematic or source hierarchy file and a target schematic or target hierarchy file as well as an allocated room for such a delta matrix for computations therebetween. Such memory may also provide storage space for programs or user interface swap memory.

A comparator module 810 may act to compare hierarchical trees 501 and 502 as seen in FIG. 5. Such a comparator may compare the encoded values of the inherent or intrinsic parameters of each tree structure 501 and 502 respectively. Such comparison may be made through the subtraction of corresponding levels of the respective trees 501 and 502. An encoder element 808 may be included to traverse the levels of each respective tree structure 501 and 502 and encode the intrinsic parameters or properties of each level of the abstracted hierarchical tree structures 501 and 502 respectively.

A recorder module 806 may be provided to record such things as the lookup table seen in FIG. 7 into memory 812 or the encoded intrinsic parameters of the trees 501 and 502 also to memory structure 812. The recorder structure or module may also keep track of individual moves through a delta matrix traversal recording each up, left, diagonal movement into an aggregated change order list. Such a change order list could then, at the conclusion of a processor system, display to a user an enumerated list of changes, including node additions, or hierarchy level modifications necessary to migrate or transform a source hierarchy or schematic to a target schematic or layout.

A matrix processor 804 may be provided. Such a matrix processor may merely be an arithmetic unit which may be operable to sum or calculate weights of adjacent matrix cells or adjacent moves.

Matrix processor 804, recorder module 806, encoder module 808, comparator module 810, memory module 812, and display unit 814 may all be interconnected with a bus structure 802 as known to one of ordinary skill in the art.

Figure 9:
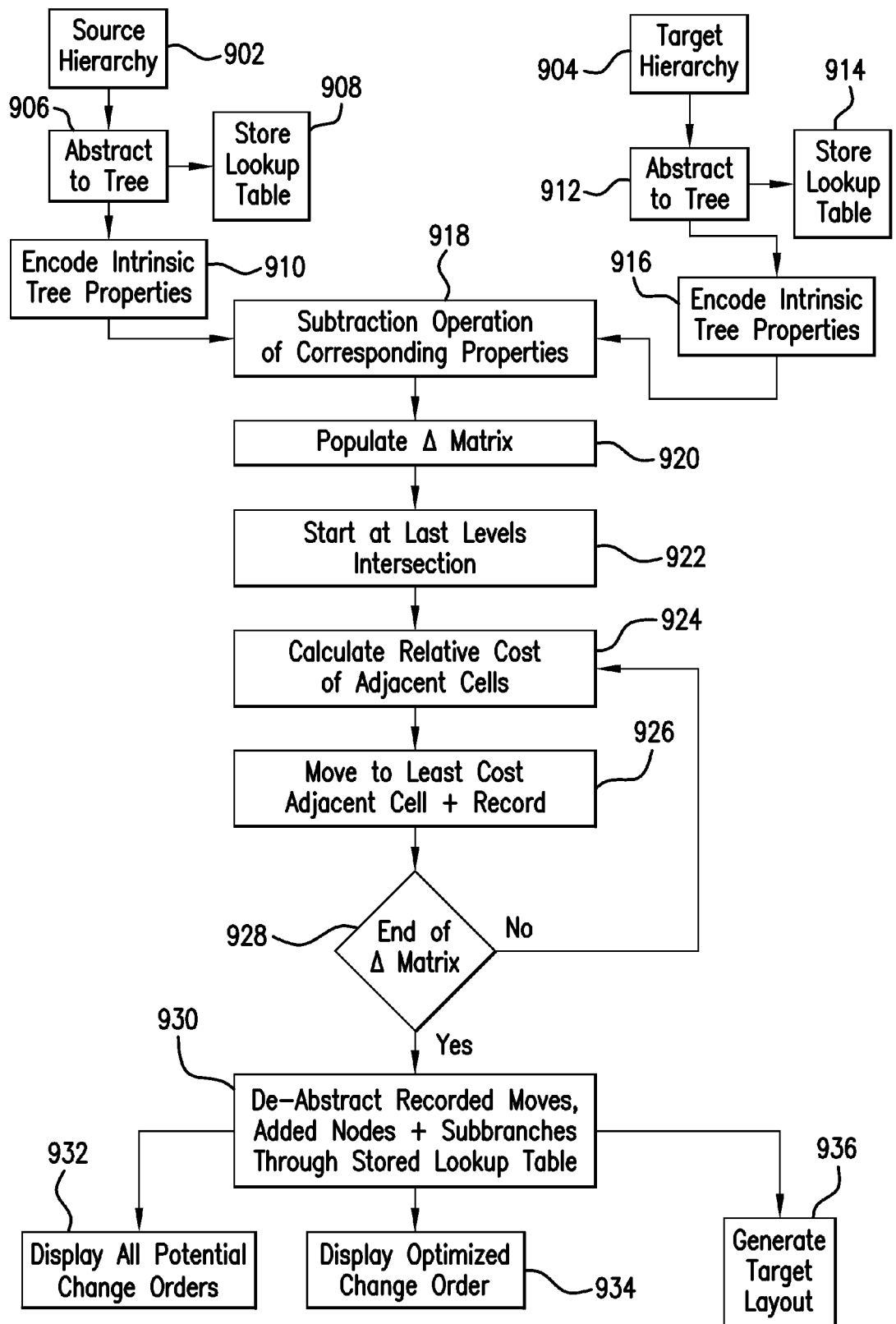
FIG. 9 is a flow diagram of a method for a hierarchy reconciliation with automated solution sets in accordance with one exemplary embodiment of the present invention.

FIG. 9 shows a flow chart starting with a source hierarchy 902 and a target hierarchy 904. Each of source hierarchy 902 and target hierarchy 904 are abstracted to tree structures 906 and 912 respectively. Concurrently a lookup table is stored in steps 908 and 914 for the source tree and target tree respectively. This lookup table may be one similar to seen in FIG. 7, but may be any data structure known to one of ordinary skill in the art suitable for storing relationships between at least two different corresponding elements.

The abstracted source tree is encoded into its intrinsic tree properties 910 and the target abstracted tree is encoded to its intrinsic tree properties at step 916. Both of the encoding steps 910 and 916 progress together in a subtraction operation of corresponding properties of the source and target encoded intrinsic tree properties. This can be performed in several different ways. In a preferred embodiment the source is subtracted from the target, however, other computations are possible, such as the subtraction of the target from the source with the appropriate use of absolute values.

Intrinsic tree properties that were encoded at step 910 may be stored in a source matrix while the encoded intrinsic tree properties of the target hierarchy at step 916 may be stored into a target matrix. At step 918 there is preferably a simple matrix subtraction operation where the target matrix is subtracted from the source matrix. These resulting values would then be populated into the delta matrix at step 920 where, preferably, one of the source or target hierarchy levels form the columns at the top and one of the source or target hierarchy levels form the rows along the left hand side of the matrix. Such a delta matrix would then have corresponding delta, result, or difference (used interchangeably herein) values corresponding to intersections between target and source hierarchy levels.

At step 922 such a populated delta matrix would begin to be traversed. Such traversal would start, preferably, at the last levels of each of the source and target hierarchies. The intersection of the last level of the source and the last level of the target hierarchy would denote the leafs, nodes, or ending points, furthest from the root levels of each source and target hierarchy. Such a traversal to calculate migration changes, or change orders can be seen in-depth at FIG. 3.

Starting at the intersection of the last levels, a cursor is maintained at cell 301. At step 924 a calculation of relative cost of adjacent cells is performed considering, at least, cell 299, cell 302, and cell 300. In a preferred embodiment a summation of the absolute values of each of the individual intrinsic parameters (encoded as triplets) is considered. As discussed earlier with reference to FIG. 3, cell 300, having triplet values 301B and 301A . . . would be summed considering the absolute value of each individual triplet value such that the summation of cell 300 would equal to the absolute value of −1=1 plus the absolute value of 2=2 for a grand total of 3.

Similarly, cell 299 may be considered where the −2 value may be considered as an absolute value of 2 which is also the summation of cell 299 as the other two triplet values are 0. Lastly, the triplet values of cell 302 would be considered as such: the absolute value of −1=1+0+0=1. As cell 302 has a value of 1 compared to a value of 3 for cell 300 and 2 for cell 299, the cursor is then moved to cell 302. Such a movement is seen at step 926 of FIG. 9 where the cursor is moved to the least-cost adjacent cell, and a recording of such a movement is made, preferably, in a change order list.

Flow chart 9 next progresses to a decision block 928 where it is evaluated whether or not the cursor or the current location has progressed or traversed through the matrix to the end. If indeed the end of the matrix or end of the delta matrix has not been reached, decision block 928 returns to a calculation step 924 to loop between steps 924, 926, and decision 928 until such time as decision block 928 is decided in the affirmative, that yes the end of delta matrix has been reached.

When the end of the delta matrix has been reached, the flow chart FIG. 9 progresses to step 930 where a de-abstraction of recorded moves, added nodes and sub-branches through the stored lookup table is performed. Thereby the individual additions of nodes e.g. A, B, J, . . . or additions of layers of hierarchy e.g. H . . . are de-abstracted back into their individual or original values as seen in tree 602 of FIG. 6.

At step 936, in a preferred embodiment, a target layout file migrated or transformed from the original source schematic file (or source layout file) is automatically generated using the change order list and the stored lookup tables for de-abstraction.

In another embodiment, an optimized change order list is displayed to a user in step 934 where the individual additions to nodes and/or hierarchy are displayed to the user for their manual intervention in migrating/transforming the source hierarchy to such a target hierarchy. In another embodiment, at step 932 all potential change orders are displayed to the user. This allows a system designer to view all possible paths of migratory/transformative steps between a source hierarchy and a target hierarchy allowing the user to pick and choose considering other constraints, objectives, and goals.

Although this invention has been described in connection with specific forms and embodiments thereof, it will be appreciated that various modifications other than those discussed above may be resorted to without departure from the spirit or scope of the invention. For example, equivalent elements may be substituted for those specifically shown and described, certain features may be used independently of other features, and in certain cases particular combinations of circuit design and implementation flows or processing steps may be reversed or interposed, all without departing from the spirit or scope of the invention as defined in the appended Claims.

What is claimed is:

1. A method for optimizing a migrated implementation of a predetermined system design comprising:

establishing a first hierarchical representation and a second hierarchical representation respectively corresponding to an original implementation and a migrated implementation of the predetermined system design, wherein each of said first hierarchical representation and said second hierarchical representation defines a plurality of elements respectively populating a plurality of levels, said levels including a root level and a plurality of subordinate levels deriving sequentially therefrom, wherein each subordinate level has at least one element deriving from an element in a preceding level;

executing a processor to generate for each level in said first and second hierarchical representations a set of intrinsic parametric values, said set of intrinsic parametric values including at least:

a first intrinsic parametric value indicative of a type of element in said each level; and a second intrinsic parametric value indicative of a type of elements in levels subordinate to said each level;

comparing corresponding intrinsic parametric values of said first and second hierarchical representations; and, executing a processor to generate responsive to a comparison of said corresponding intrinsic parametric values a least-cost sequence of changes to transform between said first hierarchical representation and said second hierarchical representation.

2. The method as recited in claim 1, wherein said set of intrinsic parametric values includes:

a terminal elements count indicative of elements in said each level without an element further branching therefrom;

a branch elements count indicative of elements in said each level having an element further branching therefrom; and, a subordinate level terminal elements count indicative of elements in levels subordinate thereto.

3. The method as recited in claim 1 further comprising: displaying said least-cost sequence of changes to transform between said first hierarchical representation and said second hierarchical representation to a user.

4. The method as recited in claim 1 wherein said predetermined system design includes a circuit layout and said first hierarchical representation and said second hierarchical representation respectively correspond to an implementation of said circuit layout in a first technology node and an implementation of said circuit layout in a second technology node.

5. The method as recited in claim 4 further comprising: applying said least-cost sequence of changes to automatically generate a migrated circuit physical layout file in the second technology node.

6. The method as recited in claim 1 wherein said comparing corresponding intrinsic parametric values includes determining difference values of a difference between each corresponding pair of intrinsic parametric values and populating a difference array with said difference values.

7. The method as recited in claim 6 further comprising comparing said difference values, each with a plurality of respective adjacent difference values in said difference array, and selecting the least value adjacent difference value.

8. The method as recited in claim 7 further comprising:

defining a starting point and an ending point in said difference array; and, iteratively comparing said difference values, selecting the least difference value adjacent to a current location, and moving to the selected least adjacent difference value until reaching said ending point to thereby enumerate a least-cost sequence of changes to transform between said first hierarchical representation and said second hierarchical representation.

9. The method as recited in claim 8 wherein said ending point is selected from one of:

an intersection of the root level of said first hierarchical representation and the root level of said second hierarchical representation; and an intersection of a first level subordinate to said root level of said first hierarchical representation and a first level subordinate to said root level of said second hierarchical representation.

10. The method as recited in claim 8 wherein the step of comparing said difference values further includes according predetermined weights to each of the intrinsic parametric values.

11. A system for optimizing a migrated implementation of a predetermined system design comprising:

a storage module, operable to provide and maintain a first hierarchical representation and a second hierarchical representation respectively corresponding to an original implementation and a migrated implementation of the predetermined system design, wherein each of said first hierarchical representation and said second hierarchical representation defines a plurality of elements respectively populating a plurality of levels, said levels including a root level and a plurality of subordinate levels deriving sequentially therefrom, wherein each subordinate level has at least one element deriving from an element in a preceding level;

a survey module, operable to generate for each level in said first and second hierarchical representations a set of intrinsic parametric values, said set of intrinsic parametric values including at least:

a first intrinsic parametric value indicative of a type of elements in said each level; and a second intrinsic parametric value indicative of a type of elements in levels subordinate to said each level;

a comparator module, operable to compare corresponding intrinsic parametric values of said first and second hierarchical representations; and, a transformation-cost module, operable to generate responsive to a comparison of said corresponding intrinsic parametric values a least-cost sequence of changes to transform between said first hierarchical representation and said second hierarchical representation.

12. The system as recited in claim 11, wherein said survey module generates for each level in said first and second hierarchical representations a set of intrinsic parametric values, said set of intrinsic parametric values including:

a terminal elements count indicative of elements in said each level without an element further branching therefrom;

a branch elements count indicative of elements in said each level having an element further branching therefrom; and, a subordinate level terminal elements count indicative of elements in levels subordinate thereto.

13. The system as recited in claim 11 further comprising: a display module, operable to display said least-cost sequence of changes to transform between said first hierarchical representation and said second hierarchical representation to a user.

14. The system as recited in claim 11 wherein said predetermined system design includes a circuit layout and said first hierarchical representation and said second hierarchical representation respectively correspond to an implementation of said circuit layout in a first technology node and an implementation of said circuit layout in a second technology node.

15. The system as recited in claim 14 further comprising: a layout generation module, operable to apply said least-cost sequence of changes to said migrated circuit design to automatically generate a migrated circuit physical layout file.

16. The system as recited in claim 11 wherein said comparator module is further operable to compare corresponding intrinsic parametric values including determining difference values of a difference between each corresponding pair of intrinsic parametric values and populating a difference array with said difference values.

17. The system as recited in claim 16, said comparator is further operable to compare said difference values, each with a plurality of respective adjacent difference values in said difference array, and select the least value adjacent difference value.

18. The system as recited in claim 17 wherein:
said comparator module is further operable to define a starting point and an ending point in said difference array; and,
the system iteratively compares said difference values, selecting the least difference value adjacent to a current location, and moving to the selected adjacent difference value until reaching said ending point to thereby enumerate a least-cost sequence of changes to transform between said first hierarchical representation and said second source hierarchical representation.

19. The system as recited in claim 18 wherein said ending point is selected from one of:
an intersection of the root level of said first hierarchical representation and the root level of said second hierarchical representation; and
an intersection of a first level subordinate to said root level of said first hierarchical representation and a first level subordinate to said root level of said second hierarchical representation.

20. The system as recited in claim 18 wherein the comparator module is further operable to compare said difference values and accord predetermined weights to each of the intrinsic parametric values.

21. A computer program product for use with a computer, the computer program product comprising a tangible computer usable medium having a computer readable program code embodied therein for causing a computer to optimize migrated implementation of a predetermined system design comprising:
establishing a first hierarchical representation and a second hierarchical representation respectively corresponding to an original implementation and a migrated implementation of the predetermined system design, wherein each said first hierarchical representation and said second hierarchical representation defines a plurality of elements respectively populating a plurality of levels, said levels including a root level and a plurality of subordinate levels deriving sequentially therefrom, wherein each subordinate level has at least one element deriving from an element in a preceding level;
generating for each level in said first and second hierarchical representations a set of intrinsic parametric values, said set of intrinsic parametric values including at least:
a first intrinsic parametric value indicative of a type of elements in said each level; and
a second intrinsic parametric value indicative of a type of elements in levels subordinate to said each level;
comparing corresponding intrinsic parametric values of said first and second hierarchical representations; and,
generating responsive to a comparison of said corresponding intrinsic parametric values a least-cost sequence of changes to transform between said first hierarchical representation and said second hierarchical representation.

22. The computer program product for use with a computer as defined in claim 21, wherein the set of intrinsic parametric values includes:
a terminal elements count indicative of elements in said each level without an element further branching therefrom;
a branch elements count indicative of elements in said each level having an element further branching therefrom; and,
a subordinate level terminal elements count indicative of elements in levels subordinate thereto.

23. A method for transforming an original hierarchical tree structure to a transformed hierarchical tree structure, comprising:
establishing a source hierarchical tree structure representation and a transformed hierarchical tree structure representation defining a plurality of elements respectively populating a plurality of levels, said levels including a root level and a plurality of subordinate levels deriving sequentially therefrom, wherein each subordinate level has at least one element deriving from an element in a preceding level;
executing a processor to perform a survey of each level of said source and transformed hierarchical tree structure representations, each of said levels having a set of intrinsic parametric values, said set of intrinsic parametric values including at least one of:
a number of leaf-nodes at that level without an element further depending therefrom;
a number of sub-branches at that level having at least two elements further branching therefrom; and,
a cumulative number of leaf-nodes without an element further depending therefrom in the subordinate levels;
establishing a change order list;
executing a processor to subtract corresponding intrinsic parametric values for levels of the source hierarchical tree structure representation and transformed hierarchical tree structure representation levels to arrive at difference values for each intrinsic parametric value at each level, each of said difference values being a difference between intrinsic parametric values of levels of each corresponding source hierarchical tree representation and transformed hierarchical tree representation levels;
executing a processor to form a difference structure of said difference values for levels of said source hierarchical tree structure representation and target hierarchical tree structure representation and defining a starting point;
comparing the difference values of the intrinsic parametric values in a plurality of adjacent difference structure locations, moving to an adjacent location with the least difference values of the compared adjacent difference structure locations, appending a direction of movement into the change order list, and repeating this step until an ending location has been reached; and
displaying said change order list for transforming said source hierarchical tree structure representation to said transformed hierarchical tree structure representation.

* * * * *